United States Patent [19]
Jones

[11] 4,284,678
[45] Aug. 18, 1981

[54] HIGH RESOLUTION MASK AND METHOD OF FABRICATION THEREOF

[75] Inventor: Addison B. Jones, La Mirada, Calif.

[73] Assignee: Rockwell International Corporation, El Segundo, Calif.

[21] Appl. No.: 113,006

[22] Filed: Jan. 17, 1980

Related U.S. Application Data

[63] Continuation of Ser. No. 943,034, Sep. 18, 1978, abandoned, which is a continuation of Ser. No. 810,469, Jun. 27, 1977, abandoned.

[51] Int. Cl.³ .................... B32B 3/00; B32B 27/00; B05D 3/06
[52] U.S. Cl. .................... 428/195; 427/43.1; 427/261; 427/264; 427/270; 427/271; 428/209; 428/332; 428/337; 428/913
[58] Field of Search ............... 428/195, 199, 209, 913, 428/332, 337; 427/43, 264, 270, 271, 261, 43.1

[56] References Cited
U.S. PATENT DOCUMENTS

| | | | |
|---|---|---|---|
| 3,916,056 | 10/1975 | Feldstein | 428/209 |
| 3,962,004 | 6/1976 | Sonneborn | 427/264 X |
| 3,985,597 | 10/1976 | Zielinski | 427/264 X |
| 4,022,927 | 5/1977 | Pfeiffer et al. | 427/43 |
| 4,057,831 | 11/1977 | Jacobs et al. | 428/209 X |

OTHER PUBLICATIONS

M. B. Heritage et al., Electrochemical Soc. Spring Meeting, paper intitled "A Solution to the Mask Stencel Problem and Electron Projection Microfabrication", May 7, 1976.

*Primary Examiner*—Thomas J. Herbert, Jr.
*Attorney, Agent, or Firm*—H. Fredrick Hamann; Gilbert H. Friedman

[57] ABSTRACT

There is described a unique mask and method of making same. The mask is especially useful in high resolution fabrication techniques such as in making magnetic bubble domain structures, semiconductor device structures and the like. The mask includes a relatively thin membrane of suitable density and material to be substantially transparent to various types of radiation such as, but not limited to, E-beams, x-rays and the like. A pattern of material which is substantially opaque to the same radiation is provided on the membrane. To the extent necessary, a suitable auxiliary support member is attached to the membrane for supporting same.

18 Claims, 5 Drawing Figures

HIGH RESOLUTION MASK AND METHOD OF FABRICATION THEREOF

This is a continuation of application Ser. No. 943,034 filed Sept. 18, 1978, now abandoned, which, in turn, was a continuation of application Ser. No. 810,469 filed June 27, 1977, now abandoned.

BACKGROUND OF THE INVENTION

1. Field of the Invention

This invention is directed to high resolution fabrication techniques, in general, and, more particularly, to a mask and the method of making same for use in implementing these techniques.

2. Prior Art

In fabricating many devices of high resolution, such as magnetic bubble domain structures, semiconductor device structures and the like, various techniques have been developed to improve the density and the resolution of these structures. These techniques include E-beam and x-ray lithography. These techniques have been used in replicating or fabricating microcircuits capable of resolution of better than 0.1 micron. In the past, however, the resolution has been limited primarily by two factors, viz. (1) the required thickness of a heavy metal absorber for absorbing the radiation in order to provide adequate contrast and (2) the range of the electrons or photons produced by absorption of the x-rays or electrons in the mask resist. That is, the thickness of the absorber which is required generally limits the achievable linewidth inasmuch as the thickness/width aspect ratio of the absorber is generally limited to one or two. Moreover, photoelectrons generated by the absorption of the x-ray or E-beam creates problems in resolution and the like.

A commonly used source for soft x-ray lithography is aluminum. A 6 dB gold absorber thickness is approximately 3,000 angstroms for AlK radiation while the effective photoelectron range in typical resist is greater than 400 angstroms. Also it is known that the commonly used Mylar membrane having a thickness of approximately 6 microns transmits only about 50% of the AlK radiation. These characteristics provide poor resolution for fine-line lithographic purposes. To improve resolution, a CuL source has been proposed. This source requires only 850 angstroms of gold to produce a 6 dB absorber as well as having an effective photoelectron range of about 200 angstroms. While this would improve resolution by a factor of 2, the exposure time of, for example, x-rays, would be substantially increased inasmuch as the 6 micron Mylar mask transmits only about 10% of the CuL radiation. In addition, the Mylar mask does not attenuate the continuum radiation as effectively as the CuL. Consequently, contrast and resolution would be lost as compared with the system which uses aluminum as a source.

In addition, it has been proposed by others that the CuL source could be used with a thin $Al_2O_3$ or $Si_3N_4$ mask. Unfortunately, these masks have a severe disadvantage of being extremely fragile, as well as requiring special polishing in preparation of the $Al_2O_3$ mask to be suitable for use.

Also known in the art, are so-called "stencil" masks which are used in E-beam operations. However, the stencil masks have the distinct disadvantage that only "holes" can be produced—not "donuts". That is, a hollow type structure cannot be easily produced with a stencil mask operation. Also, production of high resolution stencil masks is difficult. Moreover, in E-beam operations, the Mylar membrane masks noted above relative to x-ray technologies are ineffective because of the attenuation of the E-beam.

SUMMARY OF THE INVENTION

There is provided a mask which is useful in fabrication of microcircuits of high resolution characteristics. That mask includes a membrane which is substantially transparent to most types of actinic radiation. Absorptive patterns are supported by the membrane. To the extent necessary, a suitable support member may be provided for the membrane and pattern thereon.

DESCRIPTION OF THE PREFERRED EMBODIMENT

In describing the mask and a preferred method of fabricating same, the fabrication technique is described, step-wise, with the mask produced by the method being ultimately shown. Alternative fabrication techniques are described, as well.

Figure 1:
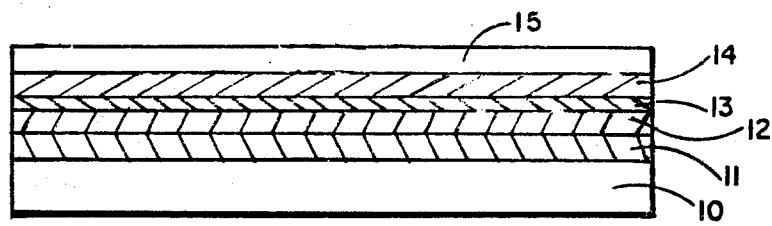
FIGS. 1–4 show the steps in the fabrication technique for producing the mask of the instant invention.

Referring now to FIG. 1, there is shown a composite structure which is produced in fabricating the mask. Initially, a suitable substrate 10 is provided. Typically, substrate 10 is a highly polished substrate and may be formed of suitable material such as silicon or glass. Of course, any other suitable material is contemplated. Substrate 10 provides support and thermal grounding for the mask defined hereinafter during fabrication. A layer 11 of a suitable release agent such as a resist material, soap film, or vacuum deposited layer of highly soluble material is then disposed on a surface of substrate 10. Release layer 11 may be deposited in any suitable manner such as spinning, dipping, vacuum deposition, spraying, or the like. A layer 12 of a polymer film is then deposited on release agent layer 11. Typically, layer 12 can be formed of a suitable polymer film such as parylene. Polymer film 12 may be deposited in any suitable fashion such as by spinning, plasma discharge, vacuum deposition techniques such as sputtering, or evaporation, and other techniques which are known in the art.

A thin layer 13 which may be formed of titanium, is deposited on the surface of polymer film 12. Typically layer 13 is deposited by sputtering or thermal evaporation or the like. While layer 13 is preferably titanium, other materials such as chromium, vanadium, aluminum, or other easily oxidized metals can also be used. Layer 13 provides a desirable adhesion layer between layers 12 and 14 as well as an etchant stop as described hereinafter.

Layer 14 of a suitable absorbing material such as rare earth oxides, gold, platinum, iridium, uranium or other dense, high atomic number elements, is then deposited on layer 13 of titanium #1. Again, absorbing layer 14 can be deposited in any suitable fashion known in the art such as sputtering, thermal evaporation or the like. Finally, a layer or film 15 of a suitable type of resist is deposited on the surface of layer 14. In a preferred embodiment, layer 15 is a PMMA E-beam resist which is known in the art. This resist is typically applied by spinning.

In the illustrative embodiment, substrate 10 which may be fabricated of polished silicon or glass has a thickness of approximately 0.25 mm to 1 mm. This dimension is not critical except as to provide strength for handling. Release agent layer 11 typically has a thickness of less than 1 micron. Parylene layer 12 may have a thickness on the order of 0.2 microns to 2.0 microns and is substantially transparent to actinic radiation, such as soft x-rays, low voltage E-beams and the like. Absorber layer 14 may be of similar dimensions. Thin metal layer 13 is typically on the order of 300 angstroms if used as an etch stop. Only 100 angstroms are needed if layer 13 is used solely as an adhesion enhancing layer. Resist layer 15 is approximately 0.5 microns. Of course, as suggested supra, these dimensions are illustrative only and indicate a preferred embodiment. However, it should be understood that modifications can be made in these suggested dimensions in order to optimize the mask operation and characteristics in accordance with the fabrication technique to be applied.

Figure 2:
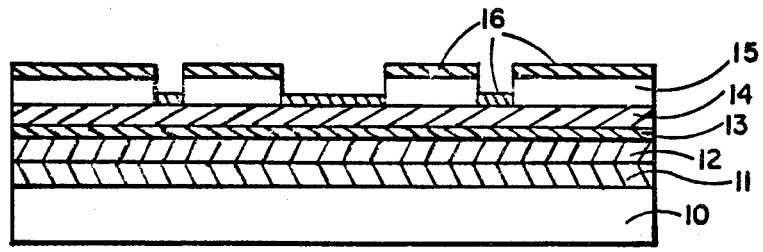

Referring now to FIG. 2, there is shown the composite constructed in accordance with the descriptions and showings in FIG. 1. However, resist 15 has been exposed and developed in the usual manner to produce a mask pattern which has apertures therein. The mask is then cleaned with a suitable plasma cleaning process as is known in the art in preparation for further operations. After the cleaning operation, layer 16 which may also be titanium is deposited on the composite including the patterned mask represented by resist layer 15. In a typical example, layer 16 is deposited in a suitable fashion such as is known in the art including thermal evaporation or sputter deposition. In the preferred embodiment, layer 16 is deposited to a thickness of approximately 1500 angstroms. The titanium layers 13 and 16 function as "getter" masks during milling which takes place in an ambient containing about $1-2 \times 10^{-5}$ Torr. oxygen. This permits very rapid removal of the absorber layer while erosion of the titanium is very slow. Again, as noted supra, other easily oxidized materials can be utilized.

Figure 3:
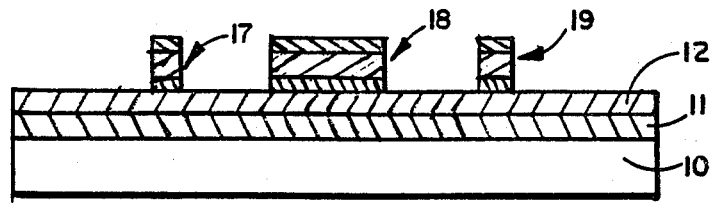

Referring now to FIG. 3, there is shown the remaining composite after layer 16 has been lifted off by moving resist layer 15 in a manner known in the art. Typical of such processes is dissolution of the resist in an appropriate solvent which does not attack the polymer mask membrane or the release agent. With the removal of resist layer 15 and titanium layer 16 thereon, the composite is subjected to ion milling techniques which are known in the art. The ion milling procedure is effective to remove those portions of absorber layer 14 not masked by titanium layer 16. Titanium layer 13 acts as an etch stop to prevent weakening of the polymer layer 12. That is, titanium layer 16 which was placed directly on gold layer 14 (see FIG. 2) functions as a mask to the ion milling procedure. By forming titanium layer 16 relatively thick, absorber layer 14 can be removed without removing the entire portion of titanium layer 16.

As is readily apparent from FIG. 3 and the procedure set forth in the paragraph above, thin polymer membrane 12 is formed to be continuous.

A suitable pattern comprising pedestals or mesas 17, 18 and 19 rising from membrane layer 12 are provided. As is clear, pedestals 17, 18 and 19 include at least portions of absorber layer 14.

Figure 4:
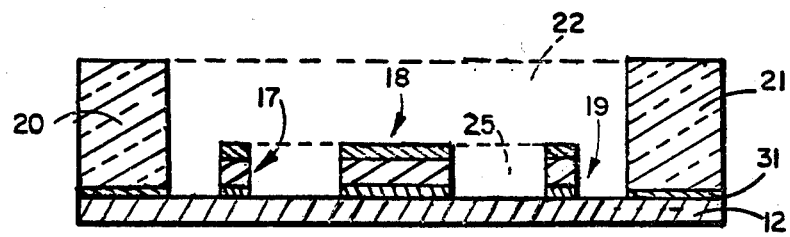

Referring now to FIG. 4, there is shown a cross-sectional view of the composite described supra, after additional operational steps. That is, suitable support elements 20 and 21 are affixed to membrane 12 by suitable adhesive means 30 and 31. In particular, support means 20 and 21 may be quartz or pyrex members which are bonded to membrane 12 by suitable bonding means such as epoxy or silicone adhesive. After support elements 20 and 21 are bonded to membrane 12, release agent layer 11 is dissolved in a familar manner. For example, in the case of a soap film a solvent such as water is supplied in a known manner whereupon layer 11 is dissipated. With the dissipation of layer 11, substrate 10 is removed from the composite leaving mask 100 comprising patterns 17, 18 and 19 affixed to membrane 12 which is supported by support elements 20 and 21. Therefore, there is provided mask 100 which is a thin polymer membrane mask. Because the membrane 12 is continuous, as has been stated above, it is capable of supporting an isolated mesa portion of the patterned layer such as mesa 18 inside support elements 20 and 21.

For completeness, elements 20 and 21 may be in a form of a ring or suitable rigid annular structure which includes portions 22 shown in dashed outline. Generally, composite pedestals or mesas 17 and 19 may be joined together by a similar pedestal or mesa 25, also shown in dashed outline.

Figure 5:
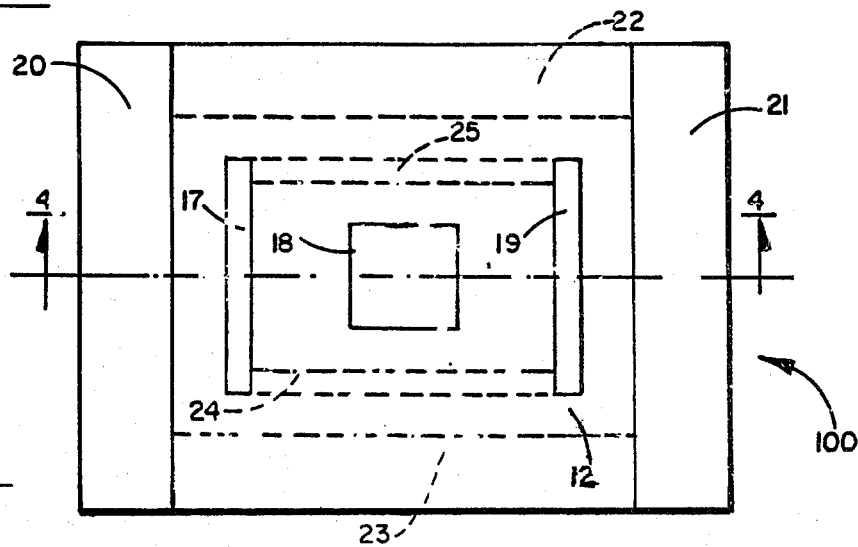
FIG. 5 is a top, plan view of one embodiment of the mask which forms the subject of the instant invention.

Referring now to FIG. 5, there is shown a top plan view of a mask produced by the fabrication technique described supra. Lines 4—4 shown in FIG. 5 indicate the cross-sectional view indicated in FIG. 4. Typically, support means 20, 21, 22 and 23 are joined together to form an annulus. These elements may be joined together in a rectilinear structure as shown. However, they may also be joined together to form a circular or oval configuration. The configuration of the support structure may be somewhat dependent upon the microfabricating techniques or equipment with which the mask 100 is used. The support structure is affixed to membrane 12 as noted supra. Pedestals or mesas 17 and 19 are affixed to membrane 12. Likewise, mesas 24 and 25 are also affixed to membrane 12 and, in this embodiment, joined together with mesas 17 and 19. These portions of the absorber devices surround mesa 18 which forms another portion of the masking pattern.

Alternative methods of fabricating mask 100 can be utilized. These alternative fabrication techniques include well known processing steps which may be utilized in addition to, or in lieu of, certain steps in the process previously described. For example, in some cases it is not essential to have a gettering-type masking layer 16 comprised of titanium. In this case, materials with a low sputtering rate such as carbon, $Al_2O_3$, or other metal oxide may be utilized in mask layer 16.

As another alternative, a thin "flash" layer of metal may be placed directly on polymer layer 12. Thereafter, the patterned resist may be disposed on the flash layer. Then a relatively thick layer of absorber material such as gold, rare earth oxides or the like may be deposited on the patterned resist layer. This deposition may be made by electroless processes or an electroplating process as well as standard vacuum deposition techniques. The resist is then removed in the usual manner taking therewith any absorber metal which has been deposited thereon. The flash layer may be removed or not as desired. That is, the flash layer if sufficiently thin does not present a problem as a conductor. However, depending upon the thickness thereof, it may be desirable to remove the flash layer in order to enhance operation of the mask. Of course, the flash layer is needed only in the plating processes. A typical lift-off process may not require the flash layer.

Other methods such as applying a resist to the membrane 12, patterning the resist, etching directly in the usual manner such as by ion milling, plasma etching, or wet chemical etching or the like, can be utilized.

Thus, there has been shown and described a preferred embodiment of a high resolution mask which is substantially transparent to actinic radiation and which permits a multitude of patterns to be defined by the mask. This mask can be used with many types of equipment such as E-beams, x-rays or the like to permit direct fabrication of wafers by means of radiation through the mask. A preferred method of fabrication of the mask as well as a description of preferred materials used in fabricating the mask is provided. As has been suggested, modifications to the material, the dimensions, the type of pattern and the like will be suggested to those skilled in the art. However, any such modifications which fall within the purview of the instant description are intended to be included therein as well. This description is intended to be illustrative only and not to be limitative. The scope of the invention is described only by the claims appended hereto.

Having thus described a preferred embodiment of the invention, what is claimed is:

1. A mask for use in fine-line lithography, comprising:
   a continuous membrane which is thin enough to be substantially transparent to radiation in the form of soft x-rays or low voltage E-beams,
   a patterned layer which is substantially opaque to said radiation,
   said patterned layer disposed on said thin membrane, and
   support means associated with said thin membrane to provide structural support at the edges of said thin membrane such that said radiation passes through the portion of said thin membrane inside said support means,
   wherein said thin, continuous membrane has a thickness in the range from about 0.2 microns to about 2.0 microns.

2. The mask recited in claim 1 wherein said support means is bonded to said thin membrane.

3. The mask recited in claim 1 wherein said support means is provided on the same side of said thin membrane as said patterned layer.

4. The mask recited in claim 1 wherein said support means surrounds said patterned layer.

5. The mask recited in claim 1 wherein said thin membrane is formed of a non-metallic material and has sufficient strength to support said patterned layer between said support means.

6. The mask recited in claim 1 wherein said thin membrane comprises a polymer.

7. The mask recited in claim 6 wherein said polymer is parylene.

8. The mask recited in claim 1 wherein said patterned layer is formed of a material which absorbs said radiation.

9. The mask recited in claim 8 wherein said material is of the class comprising rare earth oxides, gold, platinum, uranium, iridium, and other dense, high atomic number elements.

10. The method of making a mask for use in fine-line lithography, comprising the steps of:
    providing a support substrate to provide mechanical and thermal stabilization of a continuous membrane during mask fabrication,
    providing a layer of a release agent on said support substrate,
    forming on said layer of a release agent a continuous membrane of material which is thin enough to be substantially transparent to radiation in the form of soft x-rays or low voltage E-beams,
    forming on said thin membrane a patterned layer of material which is opaque to said radiation wherein said patterned layer is supported on said membrane
    affixing a support member to the edges of said thin membrane and
    removing said support substrate,
    wherein said thin, continuous membrane has a thickness in the range from about 0.2 to about 2.0 microns.

11. The method recited in claim 10 including
    polishing said support substrate prior to said membrane forming step, and
    plasma cleaning said patterned layer.

12. The method recited in claim 10 wherein said thin membrane is formed by vacuum deposition, chemical vapor deposition or plasma deposition.

13. The method recited in claim 10 including
    forming an etchant stop between said thin membrane and said patterned layer, and
    forming said patterned layer by selective etching in said layer of material which is opaque to said radiation.

14. The method recited in claim 13 including
    providing a gettering mask layer over said patterned layer.

15. A mask for use in fine-line lithography, comprising:
    a continuous membrane which is thin enough to be substantially transparent to radiation in the form of low voltage E-beams,
    a patterned layer which is substantially opaque to said radiation,
    said patterned layer disposed on said thin membrane, and
    support means associated with said thin membrane to provide structural support at the edges of said thin membrane such that said radiation passes through the portion of said thin membrane inside said support means,
    wherein said thin, continuous membrane has a thickness in the range from about 0.2 to about 2.0 microns.

16. The method of making a mask for use in fine-line lithography comprising the steps of:
    providing a support substrate to provide mechanical and thermal stabilization of a continuous membrane during mask fabrication,
    providing a layer of a release agent on said support substrate,
    forming on said layer of a release agent a continuous membrane of material which is thin enough to be substantially transparent to radiation in the form of low voltage E-beams,
    forming on said thin membrane a patterned layer of material which is opaque to said radiation wherein said patterned layer is supported on said membrane,
    affixing a support member to the edges of said thin membrane, and removing said support substrate, wherein said thin, continuous membrane has a thickness in the range from about 0.2 to about 2.0 microns.

17. A mask for use in fine-line lithography, comprising:
- a continuous membrane which is thin enough to be substantially transparent to radiation in the form of soft x-rays or low voltage E-beams,
- a patterned layer which is substantially opaque to said radiation,
- said patterned layer disposed on said thin membrane, and
- support means associated with said thin membrane to provide structural support at the edges of said thin membrane such that said radiation passes through the portion of said thin membrane inside said support means,
- wherein said membrane is capable of supporting isolated mesa portions of said patterned layer, and
- wherein said thin, continuous membrane has a thickness in the range from about 0.2 to about 2.0 microns.

18. The method of making a mask for use in fine-line lithography, comprising the steps of:
- providing a support substrate to provide mechanical and thermal stabilization of a continuous membrane during mask fabrication,
- providing a layer of a release agent on said support substrate,
- forming on said layer of a release agent a continuous membrane of material which is thin enough to be substantially transparent to radiation in the form of soft x-rays or low voltage E-beams,
- forming on said thin membrane a patterned layer of material which is opaque to said radiation wherein said patterned layer is supported on said membrane and wherein said membrane is capable of supporting isolated mesa portions of said patterned layer,
- affixing a support member to the edges of said thin membrane, and
- removing said support substrate,
- wherein said thin, continuous membrane has a thickness in the range from about 0.2 to about 2.0 microns.

* * * * *